United States Patent
Kuan

(10) Patent No.: US 11,448,607 B2
(45) Date of Patent: Sep. 20, 2022

(54) CHARGED PARTICLE BEAM INSPECTION OF UNGROUNDED SAMPLES

(71) Applicant: ASML Netherlands B.V., AH Veldhoven (NL)

(72) Inventor: Chiyan Kuan, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 295 days.

(21) Appl. No.: 16/470,928

(22) PCT Filed: Dec. 4, 2017

(86) PCT No.: PCT/EP2017/081334
§ 371 (c)(1),
(2) Date: Jun. 18, 2019

(87) PCT Pub. No.: WO2018/114299
PCT Pub. Date: Jun. 28, 2018

(65) Prior Publication Data
US 2020/0088657 A1 Mar. 19, 2020

Related U.S. Application Data

(60) Provisional application No. 62/436,095, filed on Dec. 19, 2016, provisional application No. 62/461,974, (Continued)

(51) Int. Cl.
*G01N 23/225* (2018.01)
*H01J 37/22* (2006.01)
(Continued)

(52) U.S. Cl.
CPC .......... *G01N 23/225* (2013.01); *H01J 37/153* (2013.01); *H01J 37/21* (2013.01);
(Continued)

(58) Field of Classification Search
CPC ............. G01N 23/225; G01N 137/222; G01N 137/21; G01N 137/153; G01N 137/3005;
(Continued)

(56) References Cited

U.S. PATENT DOCUMENTS

| 5,329,133 A | 7/1994 | Uesugi et al. |
| 7,253,410 B1 | 8/2007 | Bertsche et al. |

(Continued)

FOREIGN PATENT DOCUMENTS

| CN | 1514231 A | 7/2004 |
| CN | 1820346 A | 8/2006 |

(Continued)

OTHER PUBLICATIONS

Notification of Reason(s) for Refusal issued by the Korean Patent Office in related Patent Application No. 10-2019-7020624, dated Jul. 7, 2020 (10 pgs.).

(Continued)

*Primary Examiner* — Kiet T Nguyen
(74) *Attorney, Agent, or Firm* — Finnegan, Henderson, Farabow, Garrett & Dunner, LLP

(57) ABSTRACT

Systems and methods are provided for dynamically compensating position errors of a sample. The system can comprise one or more sensing units configured to generate a signal based on a position of a sample and a controller. The controller can be configured to determine the position of the sample based on the signal and in response to the determined position, provide information associated with the determined position for control of one of a first handling unit in a first chamber, a second handling unit in a second chamber, and a beam location unit in the second chamber.

15 Claims, 14 Drawing Sheets

Related U.S. Application Data filed on Feb. 22, 2017, provisional application No. 62/566,189, filed on Sep. 29, 2017.

(51) Int. Cl.
  *H01J 37/30* (2006.01)
  *H01J 37/153* (2006.01)
  *H01J 37/21* (2006.01)

(52) U.S. Cl.
  CPC ........ *H01J 37/222* (2013.01); *H01J 37/3005* (2013.01); *H01J 2237/004* (2013.01); *H01J 2237/0044* (2013.01); *H01J 2237/0048* (2013.01); *H01J 2237/1538* (2013.01)

(58) Field of Classification Search
  CPC ........ H01J 37/222; H01J 37/21; H01J 37/153; H01J 37/3005; H01J 2237/004; H01J 2237/0044; H01J 2237/0048; H01J 2237/1538
  USPC ......................................... 250/307, 306, 310
  See application file for complete search history.

(56) References Cited

U.S. PATENT DOCUMENTS

| | | | |
|---|---|---|---|
| 8,063,363 | B2 | 11/2011 | Yeh et al. |
| 8,094,428 | B2 | 1/2012 | Wang et al. |
| 9,194,826 | B2 * | 11/2015 | Kaga ........................ H01J 37/28 |
| 9,666,412 | B1 | 5/2017 | Litman et al. |
| 2002/0047093 | A1 | 4/2002 | Son et al. |
| 2008/0296496 | A1 | 12/2008 | Zhao et al. |
| 2011/0303843 | A1 * | 12/2011 | Omori .................... G01B 15/04 |
| | | | 250/307 |
| 2012/0235036 | A1 * | 9/2012 | Hatakeyama ........... H01J 37/20 |
| | | | 250/310 |
| 2013/0204569 | A1 * | 8/2013 | Goren ................ G01N 21/9501 |
| | | | 702/117 |
| 2013/0306866 | A1 * | 11/2013 | Hoque .................... H01J 37/28 |
| | | | 250/310 |
| 2015/0076349 | A1 * | 3/2015 | Sasajima ............ G01N 23/2251 |
| | | | 250/310 |

FOREIGN PATENT DOCUMENTS

| | | |
|---|---|---|
| CN | 101738845 A | 6/2010 |
| CN | 102053098 A | 5/2011 |
| CN | 102629540 A | 8/2012 |
| CN | 103358035 A | 10/2013 |
| CN | 103688333 A | 3/2014 |
| CN | 104216239 A | 12/2014 |
| CN | 104217910 A | 12/2014 |
| WO | WO 2000/014765 | 3/2000 |

OTHER PUBLICATIONS

Office Action and Search Report issued from the Intellectual Property Office of ROC Taiwan Patent Application No. 106144089, dated Nov. 19, 2018 (4 pages).
International Search Report and Written Opinion dated Feb. 2, 2018, for corresponding PCT International Application No. PCT/EP2017/081334 (3 pages).
Notification of Reason(s) for Refusal issued in related Korean Patent Application 10-2019-7020624; dated Jan. 27, 2020 (4 pgs.).
First Office Action issued by the Chinese Patent Office in a related CN Application No. 2017800784275, dated Apr. 2, 2021 (14 pgs.).
Search Report issued by the Chinese Patent Office in a related CN Application No. 2017800784275, dated Mar. 24, 2021 (3 pgs.).

* cited by examiner

CHARGED PARTICLE BEAM INSPECTION OF UNGROUNDED SAMPLES

CROSS-REFERENCE TO RELATED APPLICATIONS

This application is a national stage filing under 35 U.S.C. § 371 of International Application No. PCT/EP2017/081334, filed on Dec. 4, 2017, and published as WO 2018/114299 A1, which claims priority to of U.S. provisional application 62/436,095, filed on Dec. 19, 2016; to U.S. provisional application 62/461,974, filed on Feb. 22, 2017; and to U.S. provisional application 62/566,189, filed on Sep. 29, 2017. The contents of these above identified applications are each incorporated herein by reference in their entireties.

TECHNICAL FIELD

This disclosure relates to methods and apparatuses for inspecting (e.g., observing, measuring, and imaging) samples such as substrates patterned by a device manufacturing process (e.g., the manufacture of integrated circuits (ICs)) and patterning devices used therein.

BACKGROUND

A device manufacturing process may include applying desired patterns onto a substrate. A patterning device, which is alternatively referred to as a mask, a reticle or a template, may be used to generate the desired patterns. These patterns can be transferred onto a target portion (e.g., including part of, one, or several dies) on the substrate (e.g., a silicon wafer).

Transfer of the patterns may be by photolithography, where the patterns are imaged onto a layer of radiation-sensitive material (resist) provided on the substrate. A single substrate may contain a network of adjacent target portions that are successively patterned. A lithography apparatus may be used for this transfer. One type of lithography apparatus is called a stepper, in which each target portion is irradiated by exposing an entire pattern onto the target portion at one time. Another type of lithography apparatus is called a scanner, in which each target portion is irradiated by scanning the patterns through a radiation beam in a given direction while synchronously scanning the substrate parallel or anti-parallel to this direction.

It is also possible to transfer the patterns from the patterning device to the substrate by imprinting the patterns onto the substrate. One example of imprinting technology is called nanoimprint lithography (NIL). In NIL, a template with the patterns is pressed against a substrate, thereby transferring the patterns to the substrate. In an example, the substrate may have a layer of resist coated thereon and pressing the template against the substrate causes deformation of the resist. The resist may be cured (e.g., by cooling, or illumination of UV light) before the template is removed. After the resist is cured and the template removed, the layer of resist has the patterns of the template. A pattern transfer process (e.g., reactive ion etching) can be used to transfer the patterns in the resist to the substrate.

In order to monitor one or more steps of the device manufacturing process (e.g., exposure, resist-processing, etching, development, baking, imprinting, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is a method comprising: starting pre-charging a region of a sample with a first beam of charged particles; at a time later than starting pre-charging the region, starting imaging the region with a second beam of charged particles; wherein the region is electrically ungrounded.

According to an embodiment, the sample is a nanoimprint lithography template.

According to an embodiment, the region is electrically isolated from other regions of the sample by a black border.

According to an embodiment, the sample a patterning device suitable for extreme ultraviolet lithography.

According to an embodiment, the first beam of charged particles and the second beam of charged particles are the same.

According to an embodiment, a temporal spacing between starting pre-charging each FOV encompassed by the region and starting imaging that FOV is a constant.

According to an embodiment, pre-charging a FOV encompassed by the region is not temporally continuous.

According to an embodiment, imaging a FOV encompassed by the region is not temporally continuous.

According to an embodiment, signals representing interactions of the first beam and the sample are not recorded during pre-charging of the region.

According to an embodiment, signals representing interactions of the second beam and the sample are recorded during imaging of the region.

According to an embodiment, the method further comprises forming an image of the region based on the signals.

According to an embodiment, an entirety of the region is pre-charged before any FOVs in the region are imaged.

According to an embodiment, all FOVs in a column of FOVs in the region are pre-charged before any of the FOVs in that column is imaged.

According to an embodiment, each of FOVs that is pre-charged in the region is imaged before another one of the FOVs in the region is pre-charged.

Disclosed herein is a computer program product comprising a non-transitory computer readable medium having instructions recorded thereon, the instructions when executed by a computer implementing any of the above methods.

DETAILED DESCRIPTION

There are various techniques for inspecting a sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

Figure 1:
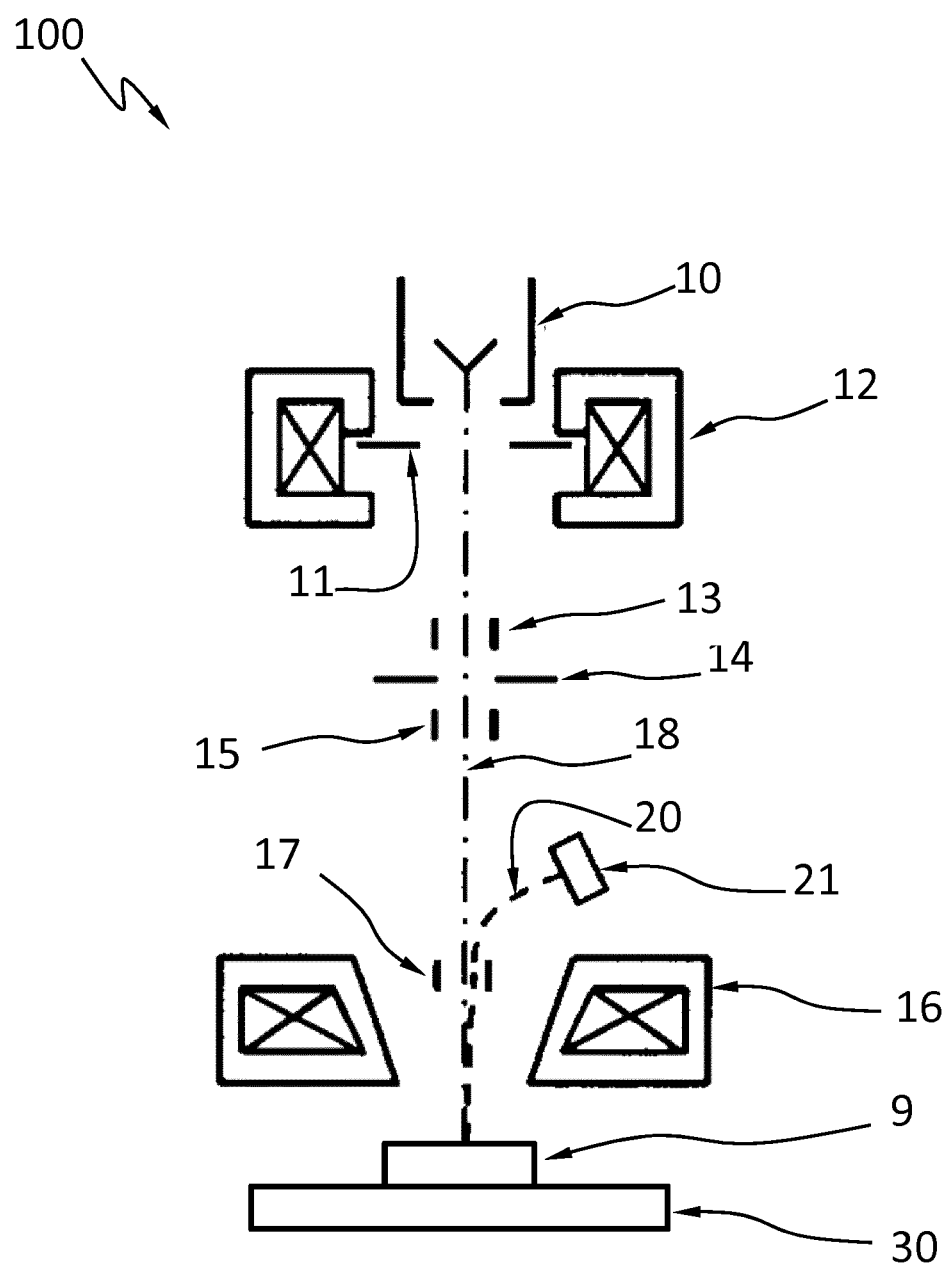
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam blanking deflector 13, an aperture 14, a scanning deflector 15, and an objective lens 16. The apparatus 100 may include components configured to detect the signal representing the interaction of the beam of charged particles and a sample, such as an E×B charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the E×B charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used.

In charged particle beam inspection, electric charges may be applied to a region of a sample before the region is imaged. The process of applying the electric charges before imaging may be called pre-charging. Pre-charging may reduce the adverse impact of non-uniform electric charge distribution in the region on imaging, or may enhance contrast by exploiting disparity in the interactions with the electric charges among features in the region.

A beam of charged particles may be used to pre-charge a region by scanning a spot generated by the beam on the sample across the entirety of the region. The same beam may also be used for imaging the region. Using the same beam of charged particles both for pre-charging and for imaging allows precise control of pre-charging. The beam of charged particles in a configuration suitable for pre-charging may be scanned across the region before the same beam in a different configuration suitable for imaging is scanned across the region.

Figure 2:
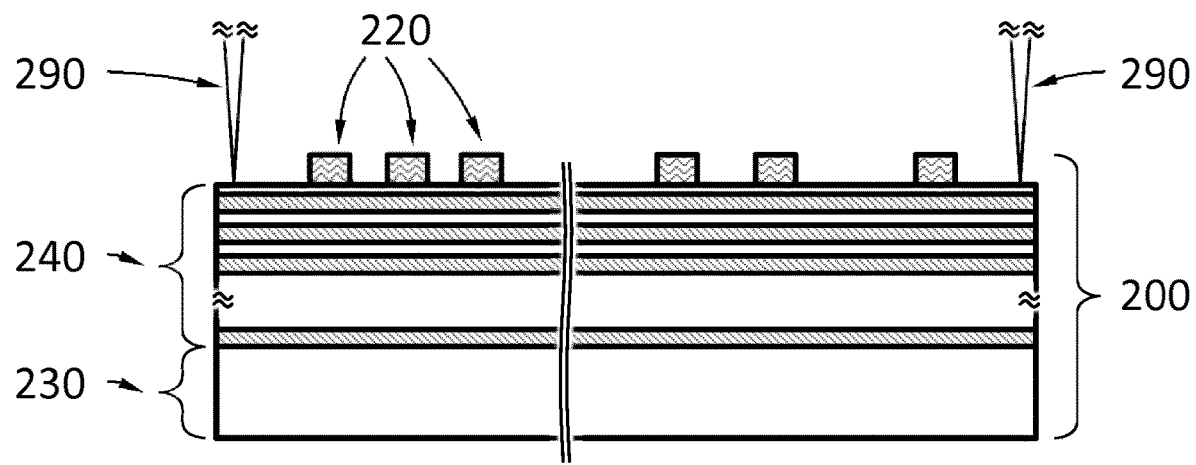
FIG. 2 schematically shows a cross-sectional view of a patterning device suitable for EUV lithography.

Some samples that need undergo charged particle beam inspection may not be suitable for being electrically grounded. One example is a patterning device for extreme ultraviolet (EUV) lithography. FIG. 2 schematically shows a cross-sectional view of a patterning device 200 suitable for EUV lithography. The patterning device 200 has a substrate 230, a reflective multilayer 240 on the substrate 230, and absorber patterns 220 on the reflective multilayer 240. The substrate 230 is configured to provide mechanical integrity for the patterning device 200. The reflective multilayer 240 is configured to reflect incident EUV light. The reflective multilayer 240 has alternating layers (e.g., Mo and Si) of different refractive indexes for the EUV light (e.g., with a wavelength of 13.5 nm) and reflects the EUV light by means of interlayer interference. The absorber patterns 220 represent the design of the structures to be formed by the device manufacturing process. The absorber patterns 220 reduce or eliminate reflection of incident EUV light by the reflective multilayer 240. The substrate 230 is usually an electrically insulating material such as quartz. Therefore, the patterning device 200 may not be electrically grounded through the substrate 230. Electrically grounding the patterning device 200 by connecting one or more electrodes 290 to the edge of the reflective multilayer 240 may be possible, despite that the presence of the electrodes 290 may increase the chance of contamination of the patterning device 200.

In some situations, the patterning device 200 cannot be electrically grounded by an electrode connected to the reflective multilayer 240, either. For example, when the reflective multilayer 240 is divided by one or more so-called "black borders" into multiple portions not electrically connected to one another, connecting the electrodes 290 to the edge of the reflective multilayer 240 would not electrically ground the patterning device 200.

Figure 3A:
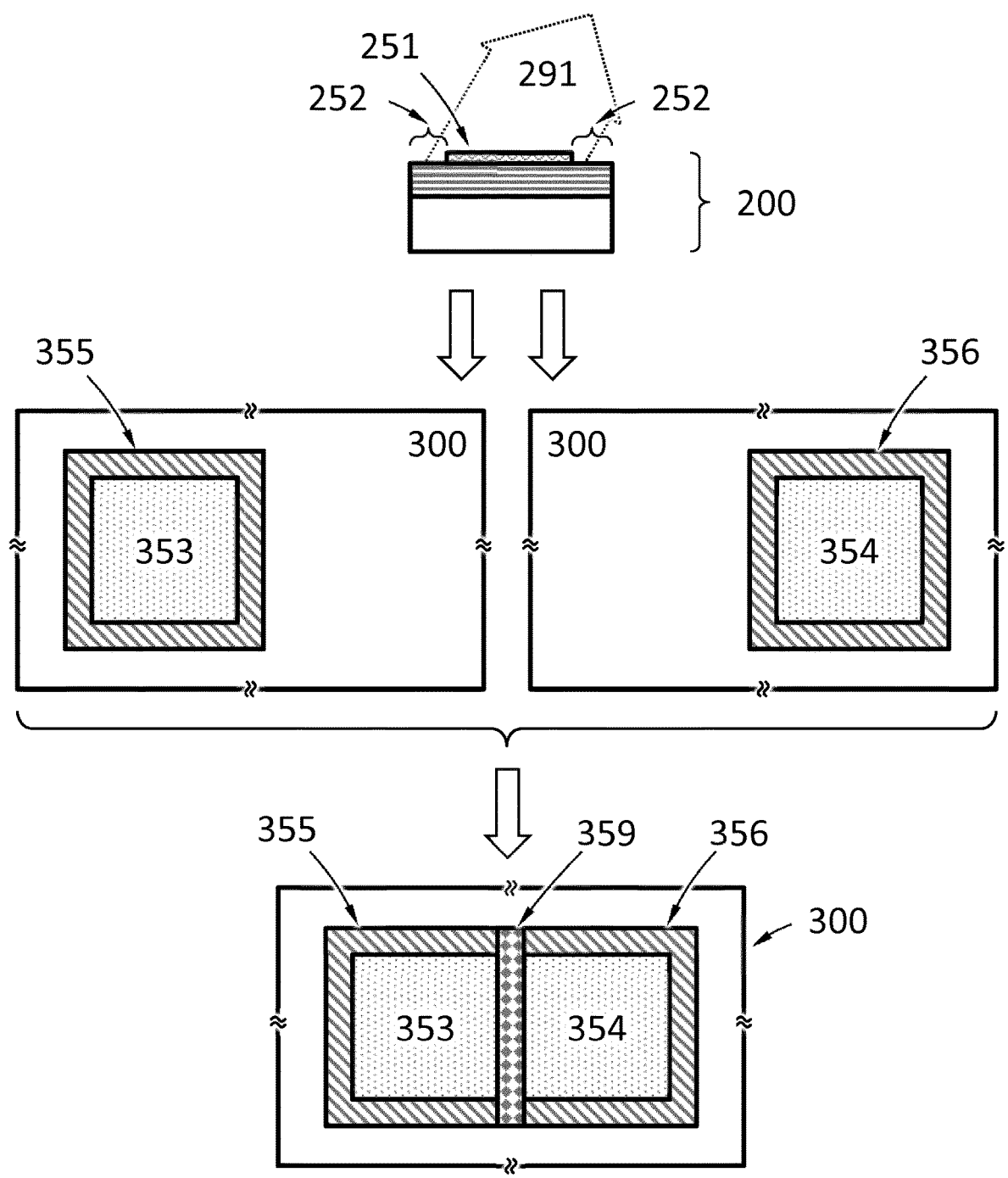
FIG. 3A schematically shows over-exposure of a peripheral region surrounding a target portion on a substrate.

A "black border" on a patterning device suitable for EUV is configured to reduce or eliminate over-exposure of a peripheral region surrounding a target portion on a substrate being exposed using the patterning device. FIG. 3A schematically shows this over-exposure. A patterning device 200 for EUV lithography has an active region 251, which contains multiple absorber patterns 220. Surrounding the active region 251 is a border region 252 of about 2-3 mm width without any absorber patterns 220. The design represented by the absorber patterns 220 may be transferred to multiple target portions (e.g., target portions 353 and 354) on a substrate 300 by multiple exposures. However, the EUV light 291 reflected from the patterning device 200 in each exposure contains a portion reflected from the border region 252. The portion reflected from the border region 252 exposes a peripheral region (e.g., 355 and 356) surrounding the target portion. When the target portions are close to one another, the peripheral regions surrounding neighboring target portions may have an overlap (e.g., 359). The overlap is exposed multiple times and thus may be over-exposed. The over-exposure may adversely impact the target portions adjacent to the overlap.

Figure 3B:
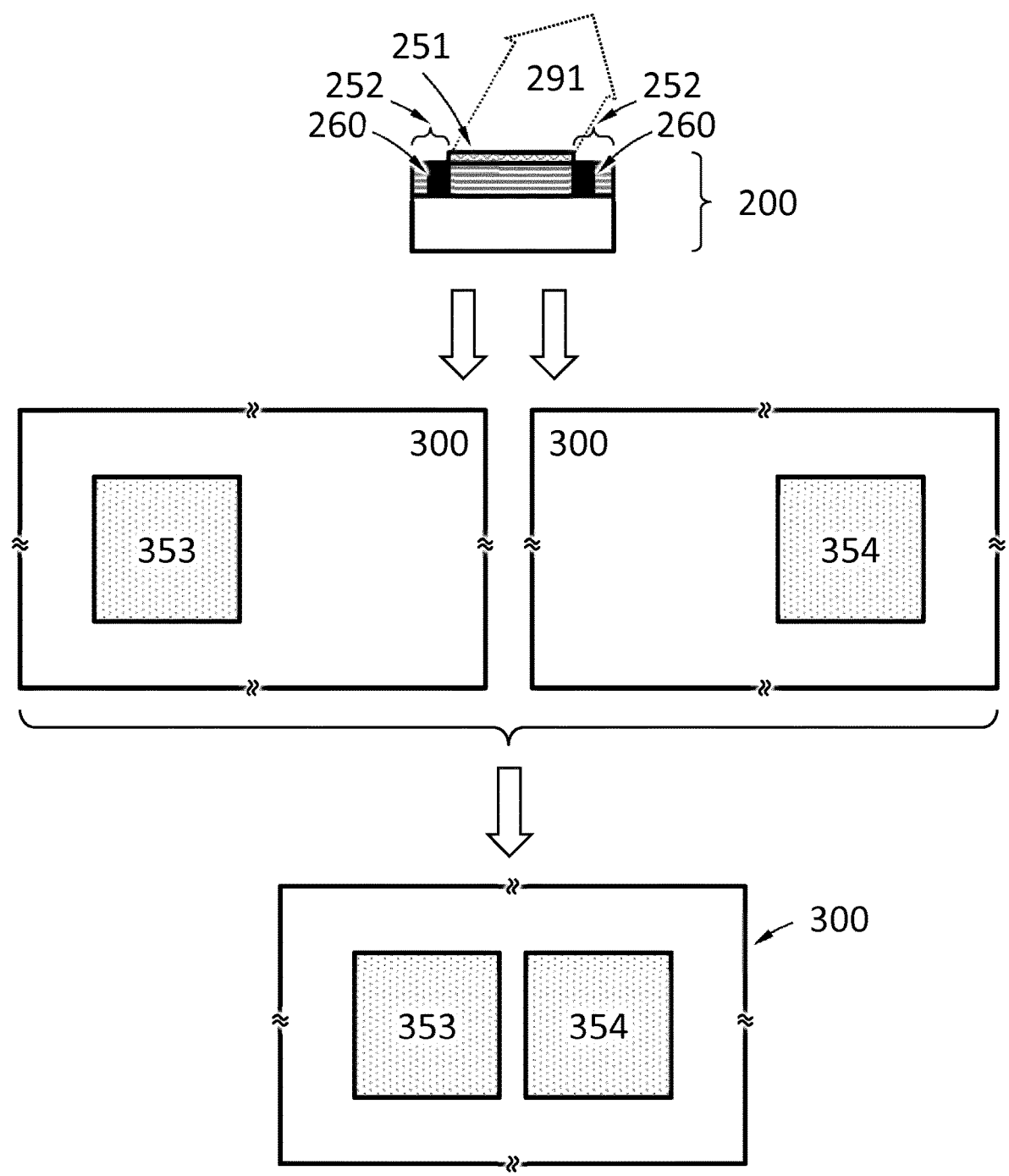
FIG. 3B schematically shows elimination or reduction of the over-exposure of FIG. 3A by a black border in the border region surrounding the active region of the patterning device.

FIG. 3B schematically shows elimination or reduction of this over-exposure by a black border 260 in the border region 252 surrounding the active region 251 of the patterning device 200. The black border 260 may be a trench extending into the reflective multilayer 240 and filled with a material. The black border 260 has much lower reflectivity of the EUV light than the reflective multilayer 240. When the black border 260 is present, the EUV light 291 reflected from the patterning device 200 in each exposure does not contain a portion reflected from the border region 252 or contains a much smaller portion reflected from the border region 252 than in the scenario in FIG. 3A. Therefore, when the black border 260 is present, the peripheral region surrounding each target portion is not exposed or receives very little exposure. Over-exposure of an overlap of the peripheral regions surrounding neighboring target portions is thus eliminated or reduced. However, the black border 260 may divide the reflective multilayer 240 into multiple portions not electrically connected to one another, thereby preventing electrical grounding of the patterning device 200 by an electrode connected to the edge of the reflective multilayer 240.

Figure 4A:
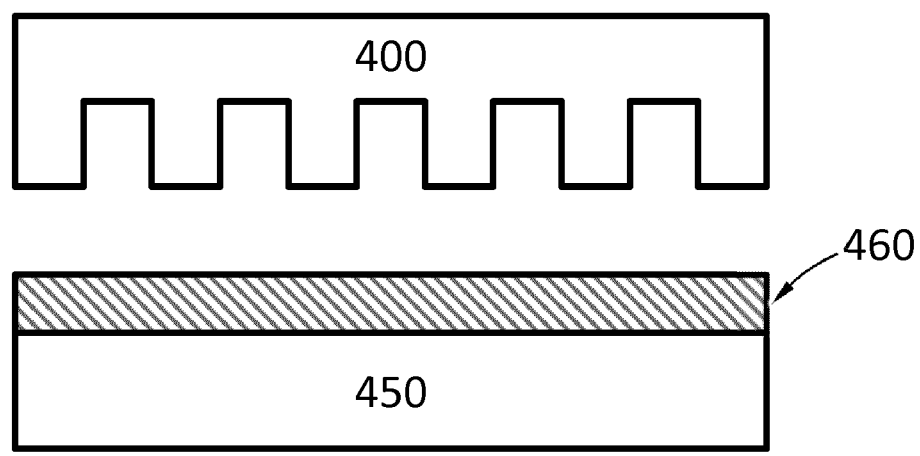
FIG. 4A schematically shows a cross-sectional view of a NIL template.
Figure 4B:
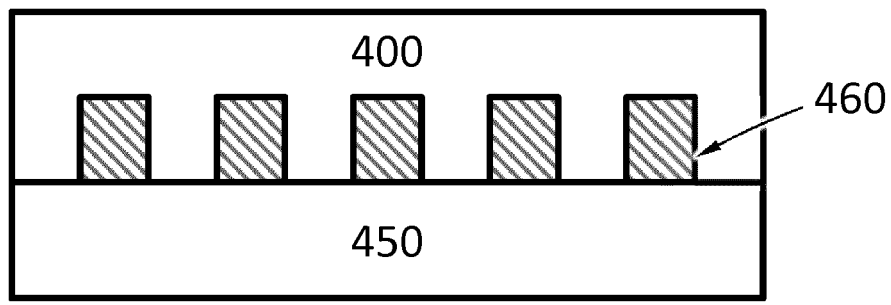
FIG. 4B schematically shows that the NIL template may be pressed against a substrate with a layer of resist thereon, and cause deformation of the resist.
Figure 4C:
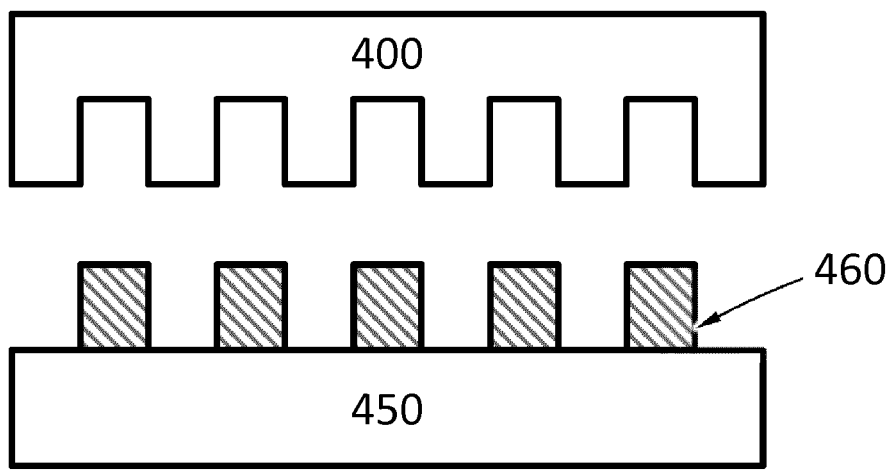
FIG. 4C schematically shows the patterns of the NIL template are left in the resist.

Another example of a sample that need undergo charged particle beam inspection but may not be suitable for being electrically grounded is a template for NIL. FIG. 4A schematically shows a cross-sectional view of a NIL template 400. The NIL template 400 is a quartz substrate with patterns formed therein. Because quartz is electrically insulating, the NIL template 400 cannot be electrically grounded. In an example, as shown in FIG. 4B, the NIL template 400 may be pressed against a substrate 450 with a layer of resist 460 thereon, and cause deformation of the resist 460. As shown in FIG. 4C, after the resist 460 is cured with the NIL template 400 is still pressed against the substrate 450, the NIL template 400 is removed, and the patterns of the NIL template 400 are left in the resist 460.

Figure 5:
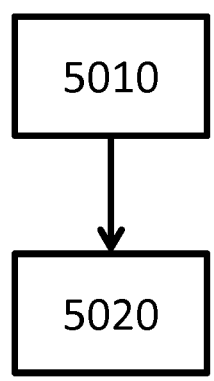
FIG. 5 schematically shows a flowchart for a method for charged particle beam inspection of a sample.

FIG. 5 schematically shows a flowchart for a method for charged particle beam inspection of a sample. Examples of the sample may include a patterning device such as a patterning device suitable for EUV lithography or a template suitable for NIL. In step 5010, pre-charging of a region of the sample is started, where the region is electrically ungrounded (e.g., a region electrically isolated from other regions of the sample by a black border). In step 5020, at a time later than starting the pre-charging of the region, imaging of the region with a beam of charged particles is started. The pre-charging of the region may use the same beam of charged particles. In an embodiment, the temporal spacing between starting pre-charging each field of view (FOV) encompassed by the region and starting imaging that FOV is a constant. A FOV is the extent that a beam of charged particles may reach on the sample, without changing the velocity (which is a vector) of the sample with respect to an absolute reference frame. The magnitude of the velocity may be zero (i.e., the sample being still) or non-zero. In an embodiment, signals representing interactions of the beam of charged particles used for pre-charging the region and the sample are not recorded during pre-charging of the region. In an embodiment, signals representing interactions of the beam of charged particles used for imaging the region and the sample are recorded during imaging of the region; an image of the region may be formed based on the recorded signals.

Figure 6A:
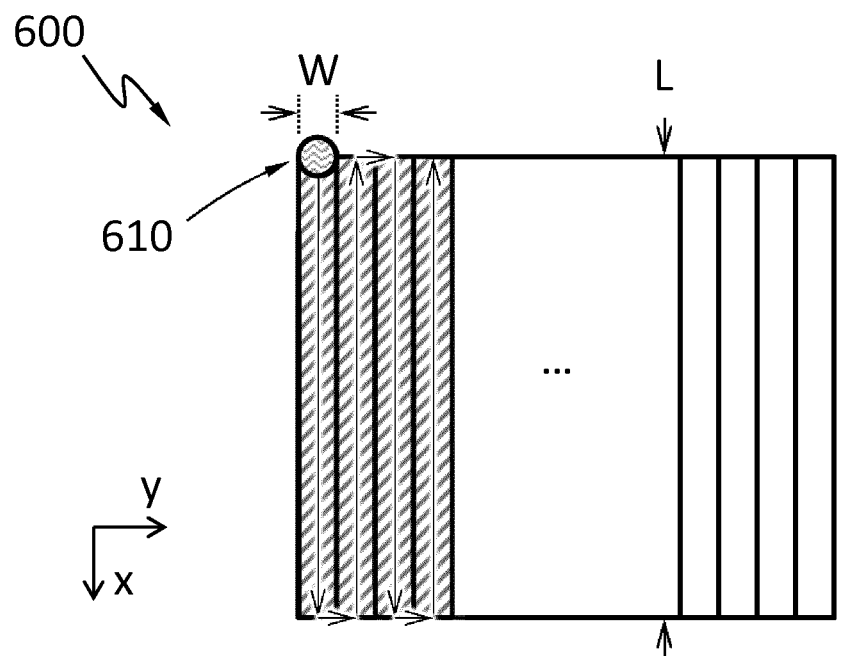
FIG. 6A schematically shows pre-charging of a FOV.

FIG. 6A schematically shows pre-charging of a FOV 600. For convenience, two directions x and y are defined in a reference frame stationary with respect to the FOV 600. The x and y directions are mutually perpendicular. A beam of charged particles generates a spot 610 in the FOV 600. The dimension of the FOV in the x direction is L. The dimension of the spot 610 in the y direction is W. The spot 610 may scan over the entirety of the FOV 600. For example, the spot 610 may repeatedly scan in the x direction by a distance of L, then in the y direction by a distance of W, then in the −x direction by a distance of L, and then in the y direction by a distance of W, until the spot 610 scans the entirety of the FOV 600. The scanning of the spot 610 may not be temporally continuous; namely pre-charging of the FOV 600 is not temporally continuous. In an embodiment, during scanning of the spot 610 across the FOV 600 (i.e., during pre-charging of the FOV 600), signals representing interactions of the beam that generates the spot 610 and the sample are not recorded.

Figure 6B:
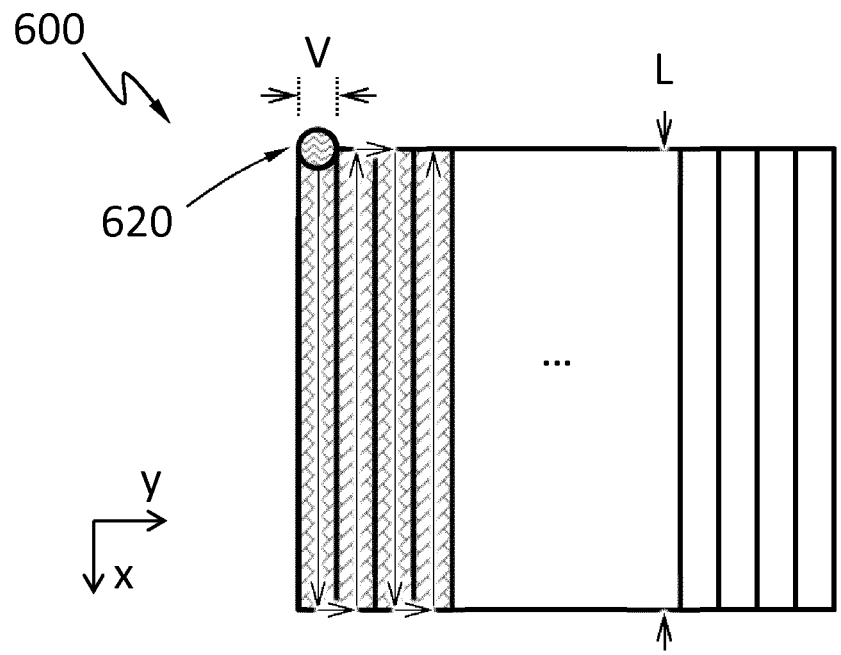
FIG. 6B schematically shows imaging of the FOV of FIG. 6A.

FIG. 6B schematically shows imaging of the FOV 600. A beam of charged particles generates a probe spot 620. The beam generating the probe spot 620 may or may not be the same as the beam generating the spot 610. The dimension of the probe spot 620 in the y direction is V, which may equal W. The probe spot 620 may scan over the entirety of the FOV 600. The probe spot 620 starts scanning the FOV 600 after the spot 610 starts scanning the FOV 600. The probe spot 620 may start scanning the FOV 600 before the spot 610 finishes scanning the entirety of the FOV 600. For example, the probe spot 620 may repeatedly scan in the x direction by a distance of L, then in the y direction by a distance of V, then in the −x direction by a distance of L, and then in the y direction by a distance of V, until the probe spot 620 scans the entirety of the FOV 600. The scanning of the probe spot 620 may not be temporally continuous; namely imaging of the FOV 600 is not temporally continuous. During scanning the probe spot 620 across the FOV 600 (i.e., during imaging of the FOV 600), signals representing interactions of the beam that generates the probe spot 620 and the sample are recorded. An image of the FOV 600 may be formed based on the recorded signals. The image may not be in a form readily perceivable by human eyes. Instead, the image may be a compilation of data representing a spatial distribution of the recorded signals.

During pre-charging or imaging of the FOV 600, the sample may or may not move with respect to an absolute reference frame. For example, if the sample moves during pre-charging or imaging of the FOV 600, the spot 610 or the probe spot 620 may follow the movement of the sample and simultaneously repeatedly scan in the x direction by a distance of L, then in the y direction by a distance of W, then in the −x direction by a distance of L, and then in the y direction by a distance of W, until the spot 610 scans the entirety of the FOV 600. Namely, the movement of the spot 610 relative to an absolute reference frame is the sum of the movement of the sample and the repeated scanning in the x direction by a distance of L, then in the y direction by a distance of W, then in the −x direction by a distance of L, and then in the y direction by a distance of W. This type of scanning may be called "continuous scan," details of which may be found in U.S. Pat. No. 8,063,363, the disclosure of which is hereby incorporated by reference in its entirety. Continuous scan may significantly enlarge the FOV.

Figure 7A:
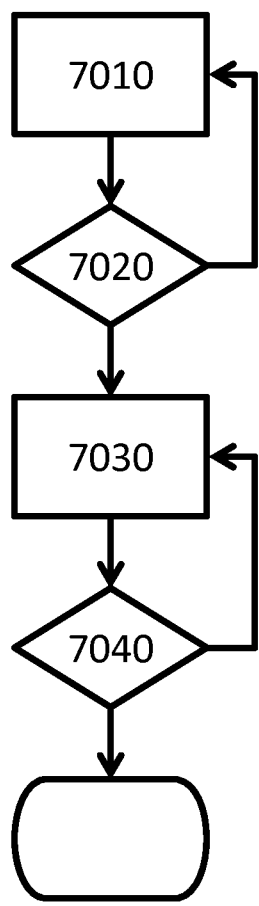
FIG. 7A schematically shows a flowchart for a method for charged particle beam inspection of a sample.

FIG. 7A schematically shows a flowchart for a method for charged particle beam inspection of a sample. Examples of the sample may include a patterning device such as a patterning device suitable for EUV lithography or a template suitable for NIL. In step 7010, a FOV in a region of the sample is pre-charged, where the region is electrically ungrounded. In step 7020, it is determined whether all the FOVs in the region are pre-charged. In response to that all the FOVs in the region are not yet pre-charged, the flow goes back to step 7010, in which another FOV in the region is pre-charged. In response to that all the FOVs in the region are pre-charged, the flow goes to step 7030, in which an FOV in the region is imaged. In step 7040, it is determined whether all the FOVs in the region are imaged. In response to that all the FOVs in the region are not yet imaged, the flow goes back to step 7030, in which another FOV in the region is imaged. In response to that all the FOVs in the region are imaged, the flow ends.

Figure 7B:
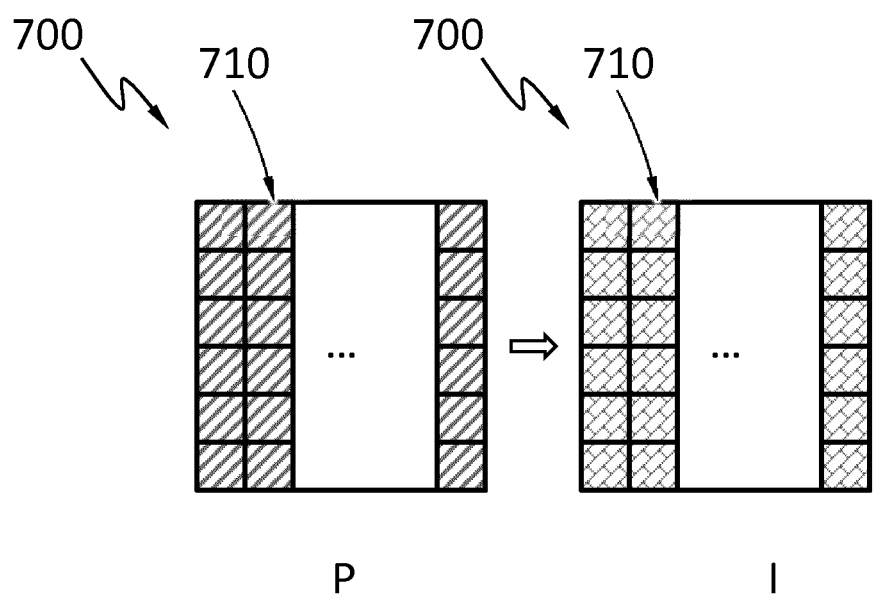
FIG. 7B schematically shows an example of using the method of FIG. 7A.

FIG. 7B schematically shows pre-charging of all the FOVs 710 of a region 700 (as indicated by the letter "P"), before imaging any of the FOVs 710 (as indicated by the letter "I") in the region 700, using the method of FIG. 7A. The entirety of the region 700 may be pre-charged one FOV at a time and imaged one FOV at a time. The order by which the FOVs in the region 700 are pre-charged may be the same as the order by which the FOVs in the region 700 are imaged.

Figure 8A:
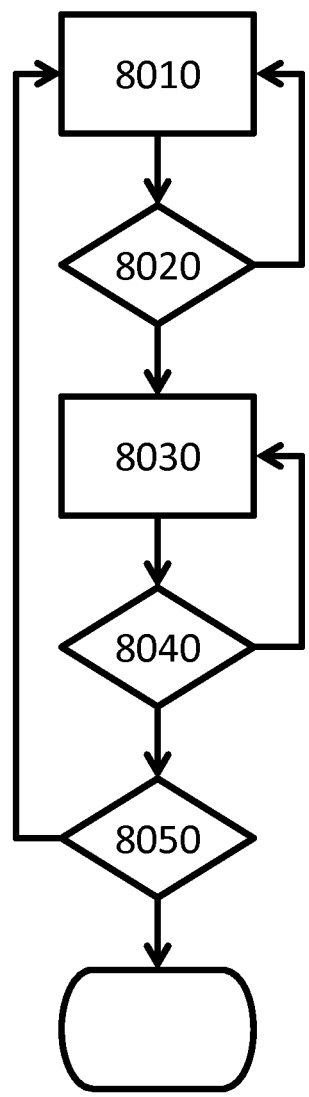
FIG. 8A schematically shows a flowchart for a method for charged particle beam inspection of a sample.

FIG. 8A schematically shows a flowchart for a method for charged particle beam inspection of a sample. Examples of the sample may include a patterning device such as a patterning device suitable for EUV lithography or a template suitable for NIL. In step 8010, a FOV in a column of FOVs in a region of the sample is pre-charged, where the region is electrically ungrounded. In step 8020, it is determined whether all the FOVs in the column are pre-charged. In response to that all the FOVs in the column are not yet pre-charged, the flow goes back to step 8010, in which another FOV in the column is pre-charged. In response to that all the FOVs in the column are pre-charged, the flow goes to step 8030, in which a FOV in the column is imaged. In step 8040, it is determined whether all the FOVs in the column are imaged. In response to that all the FOVs in the column are not yet imaged, the flow goes back to step 8030, in which another FOV in the column is imaged. In response to that all the FOVs in the column are yet imaged, the flows goes to step 8050, in which it is determined whether all the FOVs in the region are imaged. In response to that all the FOVs in the region are not yet imaged, the flow goes back to step 8010, in which a FOV in another column of FOVs in the region is pre-charged. In response to that all the FOVs in the region are imaged, the flow ends.

Figure 8B:
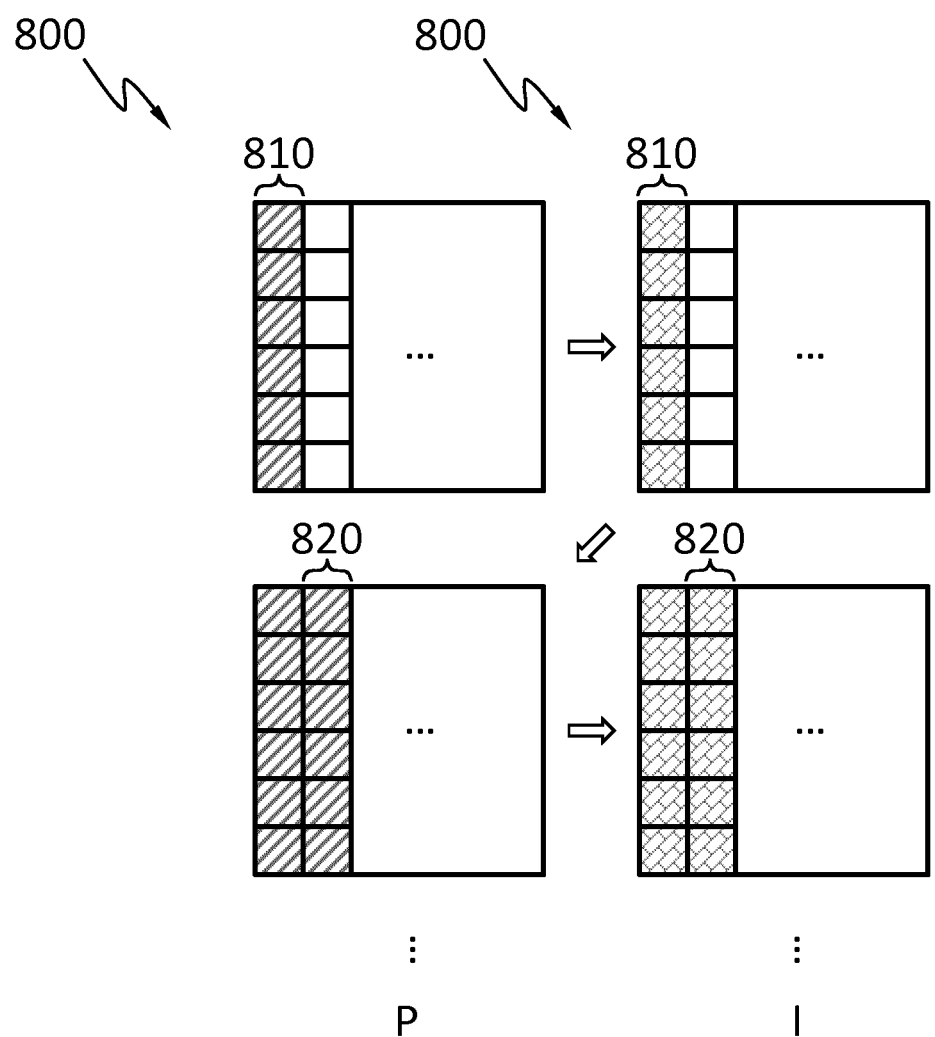
FIG. 8B schematically shows an example of using the method of FIG. 8A.

FIG. 8B schematically shows pre-charging of all the FOVs in a column (e.g., 810 and 820) of FOVs in a region 800 (as indicated by the letter "P"), before imaging any of the FOVs in that column (as indicated by the letter "I"), using the method of FIG. 8A. The column of FOVs may be pre-charged one FOV at a time, or imaged one FOV at a time. The order by which the FOVs are pre-charged may be the same as the order by which the FOVs are imaged.

Figure 9A:
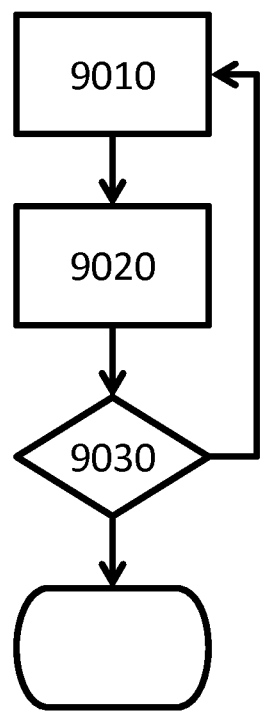
FIG. 9A schematically shows a flowchart for a method for charged particle beam inspection of a sample.

FIG. 9A schematically shows a flowchart for a method for charged particle beam inspection of a sample. Examples of the sample may include a patterning device such as a patterning device suitable for EUV lithography or a template suitable for NIL. In step 9010, a FOV in a region of the sample is pre-charged, where the region is electrically ungrounded. In step 9020, that FOV is imaged. In step 9030, it is determined whether all the FOVs in the region are imaged. In response to that all the FOVs in the region are not yet imaged, the flow goes back to step 9010, in which another FOV in the region is pre-charged. In response to that all the FOVs in the region are imaged, the flow ends.

Figure 9B:
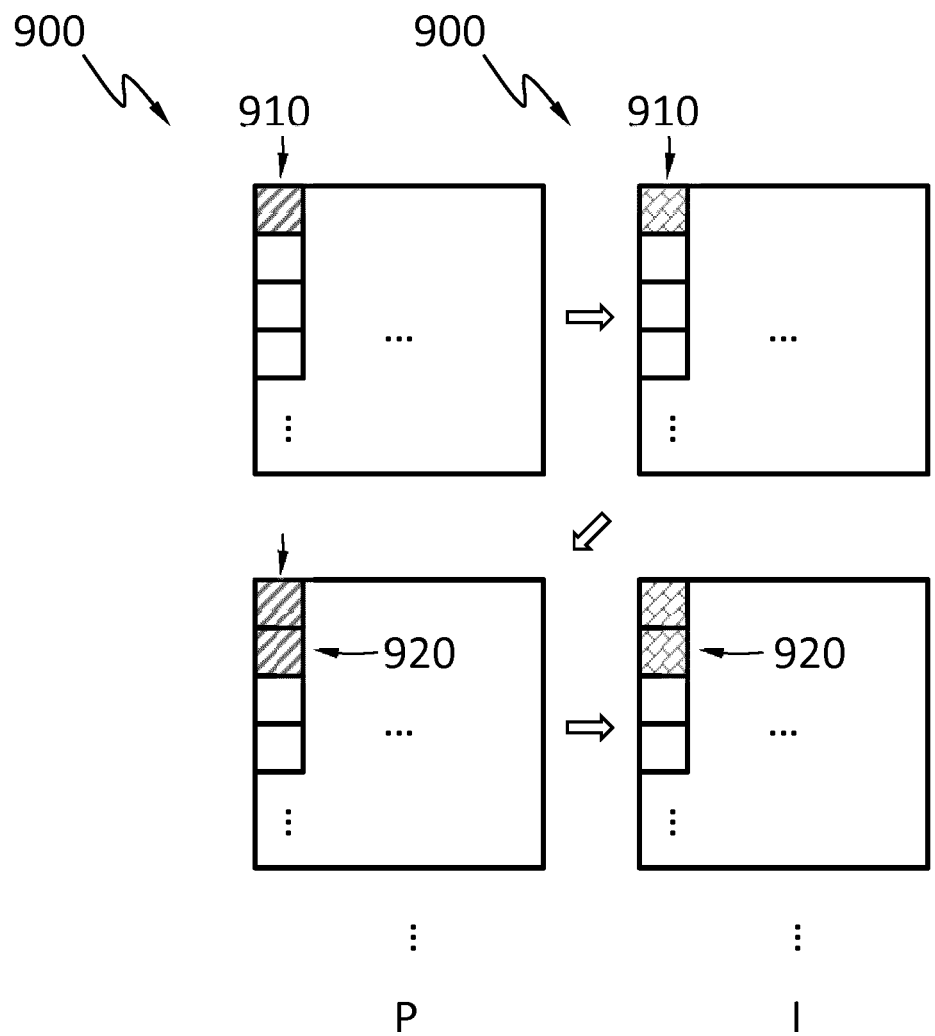
FIG. 9B schematically shows an example of using the method of FIG. 9A.

FIG. 9B schematically shows that each (e.g., FOV 910) of the FOVs that is pre-charged (as indicated by the letter "P") in a region 900 is imaged (as indicated by the letter "I") before another one (e.g., FOV 920) of the FOVs in the region 900 is pre-charged, using the method of FIG. 9A. The order by which the FOVs are pre-charged may be the same as the order by which the FOVs are imaged.

Continuous scan may be used for pre-charging a region, imaging a region, or both. For example, continuous scan may be suitable when the sample is a patterning device for EUV lithography. An active region of the patterning device for EUV lithography may be equipotential due to the electric conduction of the reflective multilayer. The region may be pre-charged or imaged using continuous scan, e.g., following the methods in U.S. Pat. No. 8,063,363. When the sample is entirely electrically insulating (e.g., a NIL template), pre-charging and imaging isolated sites one by one may be suitable.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:
   starting pre-charging a region of a sample with a first beam of charged particles generated by a source;
   at a time later than starting pre-charging the region, starting imaging the region with a second beam of charged particles generated by the source;
   wherein the region is electrically ungrounded.

2. The method of claim 1, wherein the sample is a nanoimprint lithography template.

3. The method of claim 1, wherein the region is electrically isolated from other regions of the sample by a black border.

4. The method of claim 1, wherein the sample is a patterning device suitable for extreme ultraviolet lithography.

5. The method of claim 1, wherein the first beam of charged particles and the second beam of charged particles are the same.

6. The method of claim 1, wherein a temporal spacing between starting pre-charging each FOV encompassed by the region and starting imaging that FOV is constant.

7. The method of claim 1, wherein pre-charging a FOV encompassed by the region is not temporally continuous.

8. The method of claim 1, wherein imaging a FOV encompassed by the region is not temporally continuous.

9. The method of claim 1, wherein signals representing interactions of the first beam and the sample are not recorded during pre-charging of the region.

10. The method of claim 1, wherein signals representing interactions of the second beam and the sample are recorded during imaging of the region.

11. The method of claim 10, further comprising forming an image of the region based on the signals.

12. The method of claim 1, wherein an entirety of the region is pre-charged before any FOVs in the region are imaged.

13. The method of claim 1, wherein all FOVs in a column of FOVs in the region are pre-charged before any of the FOVs in that column is imaged.

14. The method of claim 1, wherein each of FOVs that is pre-charged in the region is imaged before another one of the FOVs in the region is pre-charged.

15. A computer program product comprising a non-transitory computer readable medium having instructions recorded thereon, the instructions when executed by a computer implementing the method of any of claims 1-14.

* * * * *